United States Patent
Hu et al.

(10) Patent No.: US 8,610,241 B1
(45) Date of Patent: Dec. 17, 2013

(54) HOMO-JUNCTION DIODE STRUCTURES USING FIN FIELD EFFECT TRANSISTOR PROCESSING

(75) Inventors: Chia-Hsin Hu, Changhua (TW);
Sun-Jay Chang, Hsinchu (TW);
Jaw-Juinn Horng, Hsinchu (TW);
Chung-Hui Chen, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/494,795

(22) Filed: Jun. 12, 2012

(51) Int. Cl.
*H01L 21/70* (2006.01)

(52) U.S. Cl.
USPC ........... 257/526; 257/577; 257/594; 257/353; 257/E29.175; 257/E29.327; 438/309; 438/328

(58) Field of Classification Search
USPC .................. 257/526, 577, 594, 353, E29.175, 257/E29.327; 438/309, 328
See application file for complete search history.

(56) References Cited

U.S. PATENT DOCUMENTS 7,425,740 B2 * 9/2008 Liu et al. .................. 257/306

* cited by examiner

*Primary Examiner* — Tu-Tu Ho
(74) *Attorney, Agent, or Firm* — Lowe Hauptman & Ham, LLP

(57) ABSTRACT

Diodes and bipolar junction transistors (BJTs) are formed in IC devices that include fin field-effect transistors (FinFETs) by utilizing various process steps in the FinFET formation process. The diode or BJT includes an isolated fin area and fin array area having n-wells having different depths and a p-well in a portion of the fin array area that surrounds the n-well in the isolated fin area. The n-wells and p-well for the diodes and BJTs are implanted together with the FinFET n-wells and p-wells.

20 Claims, 17 Drawing Sheets

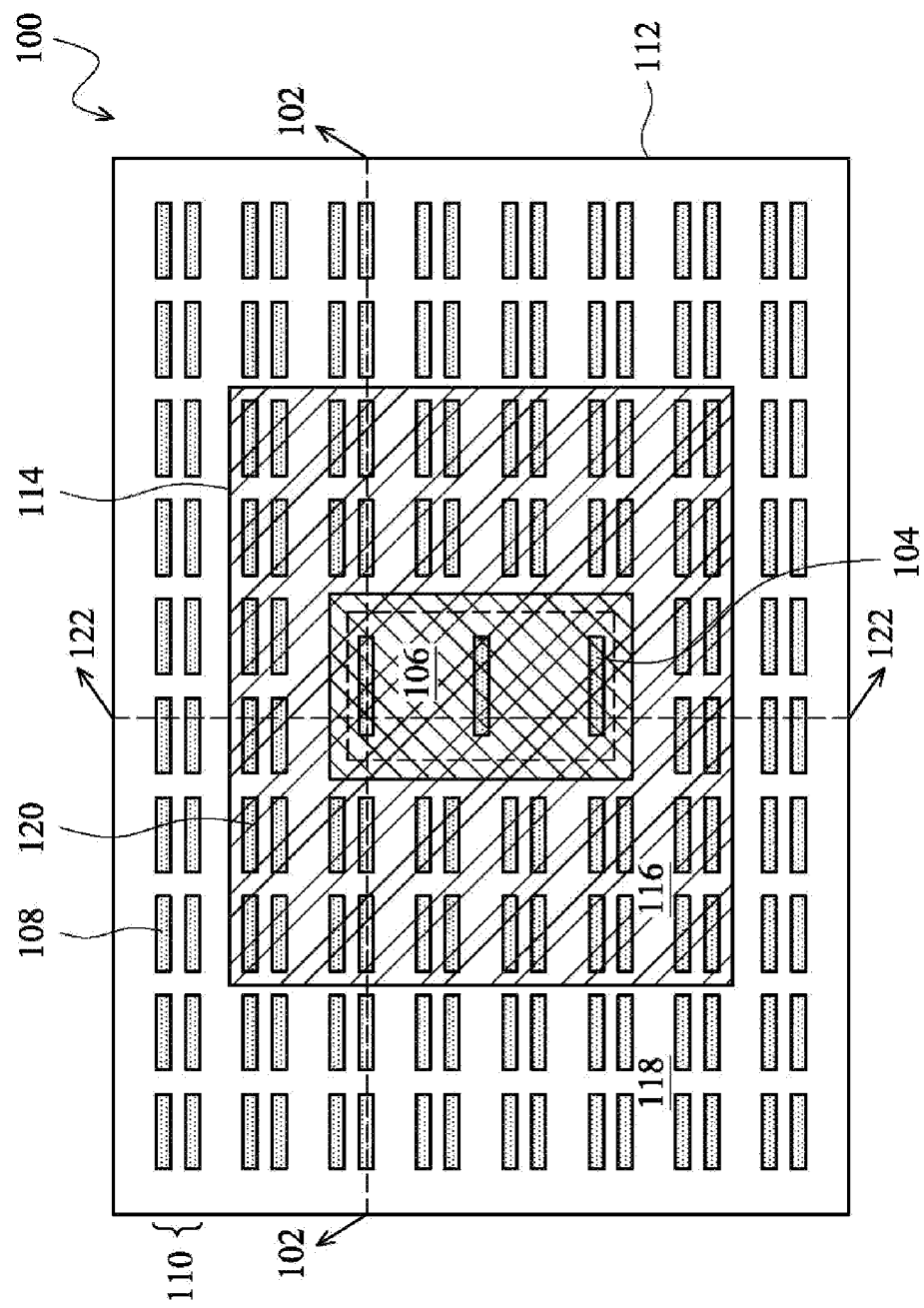

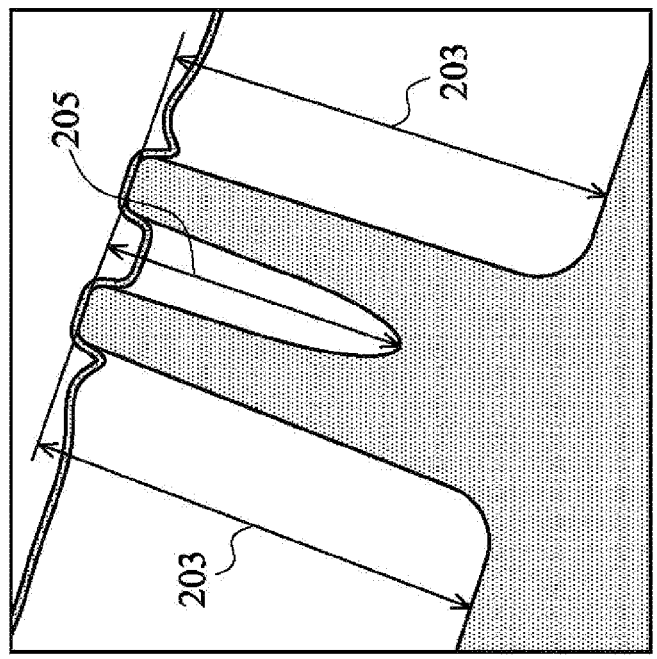
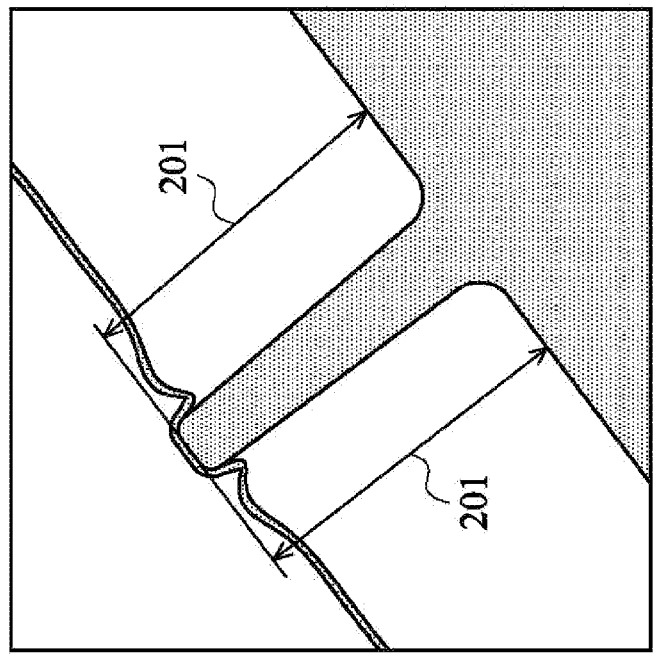
Figure 2B
Figure 2A

HOMO-JUNCTION DIODE STRUCTURES USING FIN FIELD EFFECT TRANSISTOR PROCESSING

TECHNICAL FIELD

The disclosure relates generally to integrated circuit (IC) devices, and more particularly to structure and methods for forming diode structures in IC devices that includes fin field-effect transistors (FinFETs).

BACKGROUND

In the rapidly advancing semiconductor manufacturing industry, complementary metal oxide semiconductor (CMOS) FinFET devices are used in many logic and other applications and are integrated into various different types of semiconductor devices. FinFET devices include semiconductor fins in which the channel and source/drain regions for the transistor are formed. A gate is formed over and along the sides of a portion of the semiconductor fins. The increased surface area of the channel and source/drain regions in a FinFET, as compared to planar transistors having a same device area, results in faster, more reliable and better-controlled semiconductor transistor devices.

IC devices that include CMOS FinFETs also require other semiconductor structures and transistors, such as diodes and bipolar junction transistors (BJTs). These other semiconductor structures and transistors are formed along side and concurrently with the FinFETs using the same materials and processes. In one example of thermal sensor application, diodes are formed using a p-junction of silicon germanium (SiGe) that is epitaxially grown on n-type doped silicon between isolation features and an n-junction of silicon carbide (SiC) formed across an isolation feature from the p-junction. A NPN BJT is formed using two such diodes that share the n-junction.

Diodes and BJT structures formed along side FinFETs using the same manufacturing processes that utilize fin structures formed for FinFETs while minimizing additional manufacturing steps and have improved electrical properties continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1A is a top view diagram of a partially fabricated bipolar junction transistor (BJT) formed using fin field effect transistor (FinFET) manufacturing processes in accordance with various embodiments of the present disclosure.

FIG. 2A illustrates a cross sectional view of an isolated fin area in accordance with various embodiments of the present disclosure.

FIG. 2B illustrates a cross sectional view of a fin array area in accordance with various embodiments of the present disclosure.

DETAILED DESCRIPTION

Figure 1B:
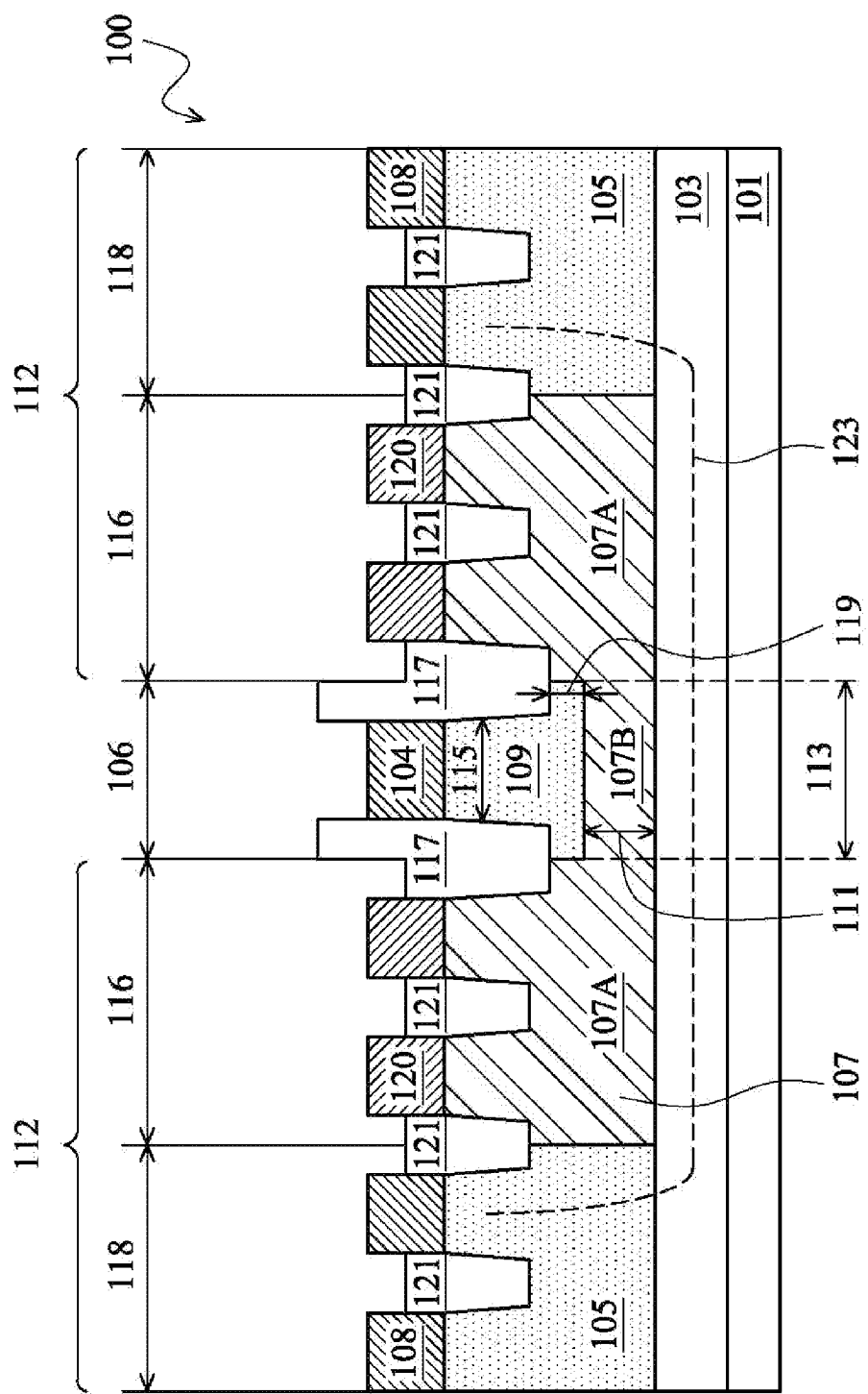
FIG. 1B is a cross section diagram of the partially fabricated BJT of FIG. 1A in accordance with various embodiments of the present disclosure.

The making and using of illustrative embodiments are discussed in detail below. It should be appreciated, however, that the disclosure provides many applicable inventive concepts that can be embodied in a wide variety of specific contexts. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Of course, the description may specifically state whether the features are directly in contact with each other. In addition, the present disclosure may repeat reference numerals and/or letters in the various examples. The specific embodiments discussed are merely illustrative and do not limit the scope of the invention.

A generic description of a fin field effect transistor (FinFET) and manufacturing process is described to provide context for the diode and bipolar junction transistor (BJT) structure and manufacturing processes. FinFETs use a substantially rectangular fin structure of silicon. The rectangular fin structure is long and narrow, having a broad side and a narrow side. The silicon fins may be formed by etching into a bulk silicon substrate through patterned hardmasks. A dielectric material such as shallow trench isolation (STI) is deposited to fill gaps between the fins. After further processing, a top portion of the fin is exposed between STI features. The fins are implanted with an n-type dopant or a p-type dopant to form n-wells or p-wells in the source/drain and channel regions. A gate dielectric layer and a gate electrode layer are deposited over the fins and the STI layer and patterned to form gate stacks over the channel region of the fins. The gate electrode layer is formed on the gate dielectric layer and may be formed of a conductive material such as doped polysilicon, metals, or metal nitrides. Fin portions not under the gate stacks are then optionally doped to form lightly doped drain and source (LDD) regions. The LDD regions may be doped by ion-implanting or by plasma doping where dopants are deposited onto the fin and annealed.

According to various embodiments of the present disclosure, a diode or BJT includes an isolated fin area and fin array area having n-wells having different depths and a p-well in the fin array area that surrounds the n-wells in the isolated fin area. The n-wells and p-well for the diodes and BJTs are implanted together with the FinFET n-wells and p-wells to avoid additional processing steps for the diode or BJT formation. By utilizing localized loading effects for etching based on fin density, different depths of STI features are formed adjacent to fins in different fin density areas. The different STI depths, in turn, allow control of implantation dosage without additional photomask steps to achieve n-wells having different depths.

FIG. 1A is a top view diagram of a partially fabricated bipolar junction transistor (BJT) or diode 100 using a FinFET manufacturing process. FIG. 1B is a diagram of a cross section plane of the BJT 100 of FIG. 1A cut by line 102. The BJT 100 includes a number of fins separated into two areas. Isolated fin area 106 includes isolated fins 104; and fin array area 112 includes fins 108 or 120 grouped into fin arrays 110. As shown, isolated fin area 106 includes 3 fins. According to various embodiments, isolated fin areas include at least 2 fins or at least 3 fins. A fin pitch in the isolated fin area is greater than about 0.3 microns. A distance between adjacent isolated fins may be about 0.3 microns to 1.2 microns. In some embodiments, the isolated fins may include 2 or more columns of isolated fins.

As shown in FIG. 1A, fin arrays 110 include 2 fins per array, but more fins may be used per array. For example, a fin array may include 3-5 fins. The number of fins per array is selected based on a required STI thickness to achieved desired implantation depth. The fin array area 112 has a higher fin density than the isolated fin area 106. An intra-array fin pitch, distance between adjacent fin centers in an array, is less than about 50 nanometers (nm). The distance between fin arrays or between nearest fins of adjacent arrays is greater than 60 nm. While FIG. 1A shows an isolated fin area 106 in the middle of the BJT 100, the isolated fin area 106 may be off-center or at an edge of the BJT 100. The fin array area 112 is separated by a box 114 into two regions: a p-well region 116 with fins 120 and an n-well region 118 with fins 108.

The isolated fin area 106 and fin array area 112 are illustrated in FIG. 1B. FIG. 1B shows the BJT 100 formed on a silicon substrate 101, which is a p-type substrate. A deep n-well 103 is formed in the p-type substrate 101 and together with an n-well 105 serves to isolate a p-well 107 so as to reduce substrate noise. The dotted line 123 shows the n-type wells linking and surrounding the p-well 107. The n-well 105 laterally surrounds the p-well 107. The p-well 107 includes two regions 107A and 107B. P-well region 107A is formed in fin array area 112 and surrounds an n-well 109. N-well 109 is in the isolated fin area 106. P-well region 107B is located between the n-well 109 and the deep n-well 103 and is contiguous with the p-well region 107A.

According to various embodiments, the p-well region 107B has a thickness 111 greater than about 35 nm. A p-type region such as p-well region 107B between n-well 109 and the deep n-well 103 prevents punch-through during operation which would disable the diode or BJT. A top portion of the n-well 109 is surrounded by isolated STI features 117 and has a width 115 that is the same as a length of the fin 104. A bottom portion of the n-well 109 has a width 113 that is greater than the width 115 of the top portion of the n-well 109. The width 113 is a maximum width of the n-well 109 and may be about 0.2 microns to about 5 microns. The bottom portion of the n-well 109 has a thickness 119, which may range from about 35 nm to about 100 nm. STI features 121 separate columns of fins in fin array area 112 and also separates the p-well region 116 and the n-well region 118 in the fin array area 112. Isolation STI features 117 have a greater thickness or depth than STI features 121, which is caused by localized loading etch effects and may be further enhanced by patterned etching. While the STI features 121 and 117 have different thicknesses, the fins 108, 120, and 104 have a same overall height. If the patterned etching is used to enhance the difference in STI thickness, the exposed portions of the fins 108, 120, and 104 would have different heights.

In the context of fin formation, localized loading etch effects result in more etching in lower fin density areas. In one example, lower etchant concentration due to mass transfer limitations within narrow features limit the etching rate in high density areas. In low density areas, the higher etchant concentration does not limit the reaction rates thus more silicon is removed. In one test as illustrated in FIGS. 2A and 2B, a fin height 201 of 170 nm is achieved in an isolated area in FIG. 2A and an intra-array fin height 205 of 100 nm is achieved in a fin array area having arrays of two fins in FIG. 2B. While the intra-array fin height 205 is much shorter than the isolated fin height 201, the fin height 203, at about 165 nm, for the entire array is about the same as the isolated fin height 201. Different height ratios, such as ratios between 201:205 or 201:203 or 203:205, can be achieved by tuning the process and varying the distances between fins and the number of fins in a fin array.

Figure 3:
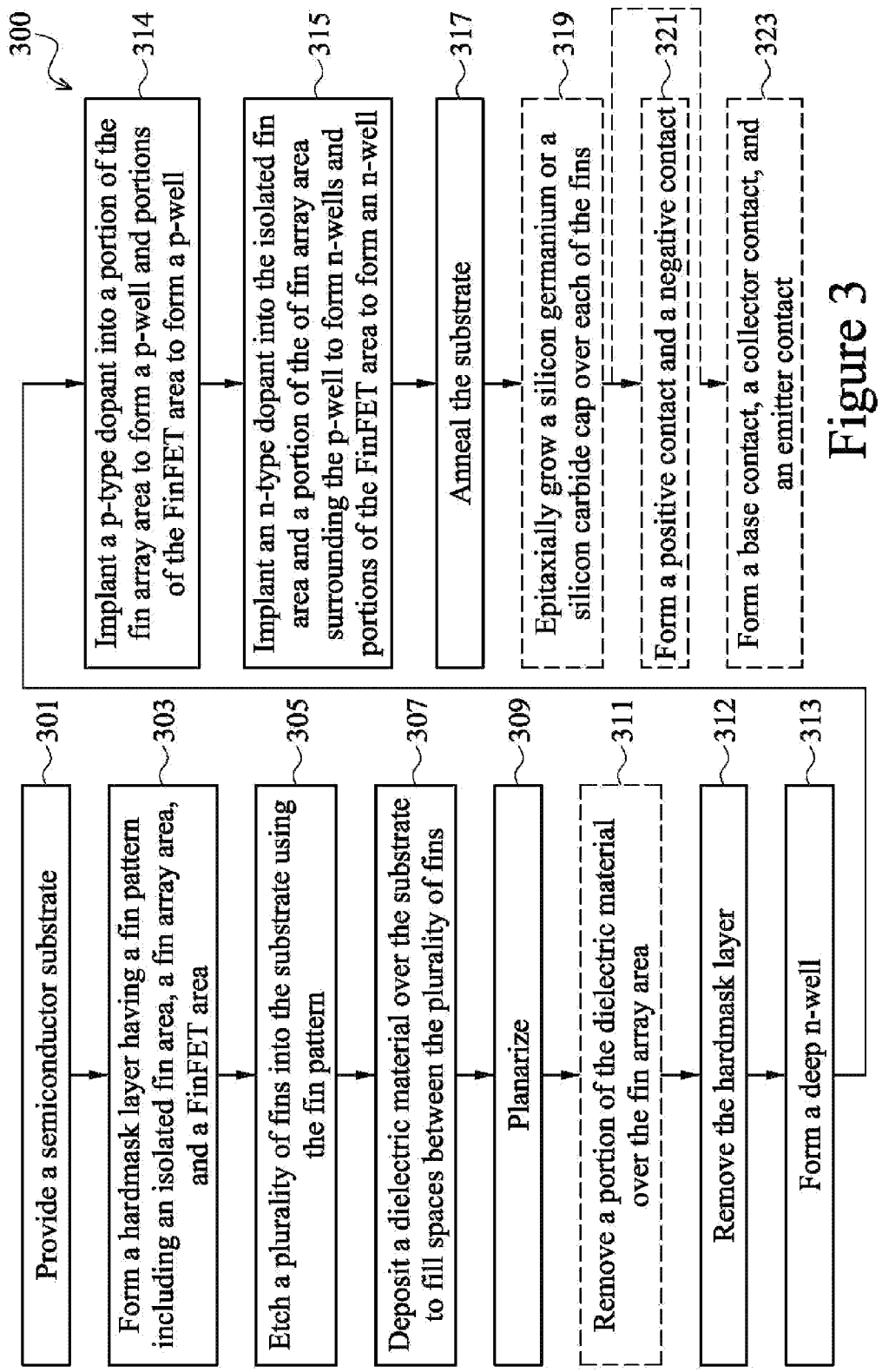
FIG. 3 is a flowchart of a method for fabricating diode and BJT structures in accordance with various embodiments of the present disclosure.

According to various embodiments of the present disclosure, the diode or BJT is formed using a process such as the method depicted in the flow chart 300 of FIG. 3. FIG. 3 is discussed together with FIGS. 4A to 4L that illustrate various partially fabricated cross-sections corresponding to one or more of the operations of FIG. 3. The cross sections of FIGS. 4A to 4L are portions of planes cut from a cut line 122 of FIG. 1A. Cut line 122 of FIG. 1A is perpendicular to cut line 102 that results in the cross-section diagram of FIG. 1B. The plane of FIGS. 4A to 4L includes the narrow sides of the fins instead of the broad sides shown in FIG. 1B. In each of the FIGS. 4A to 4L, an isolated fin area and a fin array area having a p-well region and an n-well region are included. In operation 301, a semiconductor substrate is provided. According to various embodiments, the semiconductor substrate is a silicon wafer, a silicon germanium wafer, or a silicon-on-insulator (SOI) wafer. The semiconductor substrate may be doped. According to some embodiments, the semiconductor substrate is a p-type silicon substrate. Various operations are performed on the semiconductor substrate and the semiconductor substrate with various layers in a partially fabricated state is referred to as the workpiece.

Figure 4A:
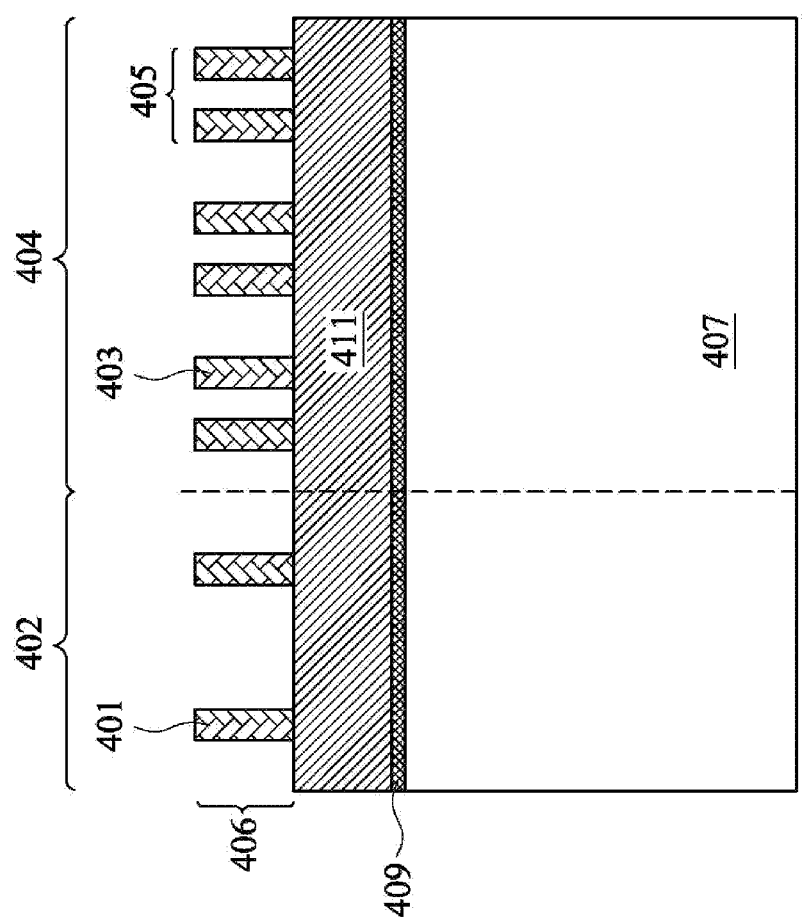
FIGS. 4A to 4L illustrate cross sections of partially fabricated devices according to various steps in the method of FIG. 3 in accordance with various embodiments of the present disclosure.

In operation 303 of FIG. 3, a hardmask layer having a fin pattern including an isolated fin area, a fin array area and a FinFET area is formed. The isolated fin area has a low fin density. The fin array having a higher fin density than the isolated fin area. The FinFET area is where the FinFETs are formed and usually includes fins at a high fin density. FIG. 4A illustrates a semiconductor substrate 407 with an isolated fin area 402 and a fin array area 404. In the fin array area 404, fins are grouped in fin arrays in groups of 2. In some embodiments, fins are grouped in fin arrays of more than 2. A distance between fins within one array is less than a spacing between fin arrays. A distance between fins in the isolated fin area 402 is at least and is usually greater than the distance between fin arrays. An adhesion layer 409 may be first deposited on the semiconductor substrate, followed by a hardmask layer 411. The adhesion layer may be a silicon oxide that adheres well to the semiconductor substrate 407 and the hardmask layer 411, which may be a silicon nitride or a silicon oxide. In some embodiments, a photoresist layer is deposited over the hardmask layer and exposed to form the fin pattern, such as the photomask patterns 401, 403, and 405. The hardmask layer 411 is etched so as to transfer the fin pattern to the hardmask layer 411. In other embodiments, a mask pattern 406 may be another hardmask layer formed as spacers deposited around photoresist mandrels (not shown) that are removed.

Figure 4B:
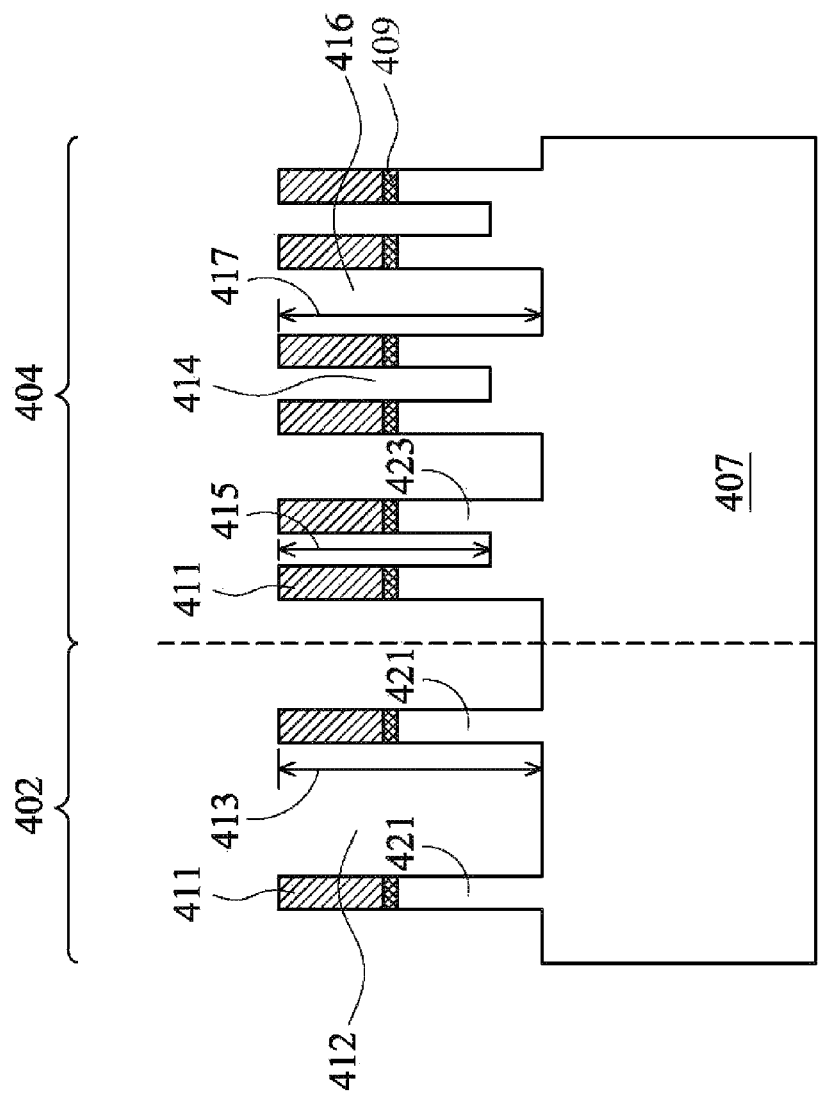

Referring back to FIG. 3, in operation 305 a plurality of fins is etched into the semiconductor substrate using the fin pattern. FIG. 4B illustrates the etch result. The etch process consumes at least part of the mask pattern 406, and only the adhesion layer 409 and the hardmask layer 411 remain over the fins. In the isolated fin area 402, fins 421 are formed with a trench 412 between them. The trench 412 has a depth 413. In the fin array area 404, fins 423 are formed in arrays of 2 fins. Due to localized loading effects, the trenches between fins have different depths. An intra-array trench 414 has a depth 415. An inter-array trench 416 has a depth 417. The trench depths 412 and 416 are greater than the intra-array trench depth 415. As discussed, the etch process and fin pattern geometry can be tuned to cause a larger or smaller difference in trench depth.

In operation 307 of FIG. 3, a dielectric material is deposited over the substrate to fill spaces between the plurality of fins. In some embodiments, the dielectric material is silicon oxide deposited using commonly used processes including chemical vapor deposition (CVD), thermal oxide deposition, or atomic layer deposition (ALD). One skilled in the art would choose the deposition process that can efficiently fill the gaps between fins. In at least one example of gaps between fins with high aspect ratios, a high density plasma (HDP) CVD process may be used. The dielectric material fills the spaces between the fins as well as covers tops of the fins to ensure complete filling.

Figure 4C:
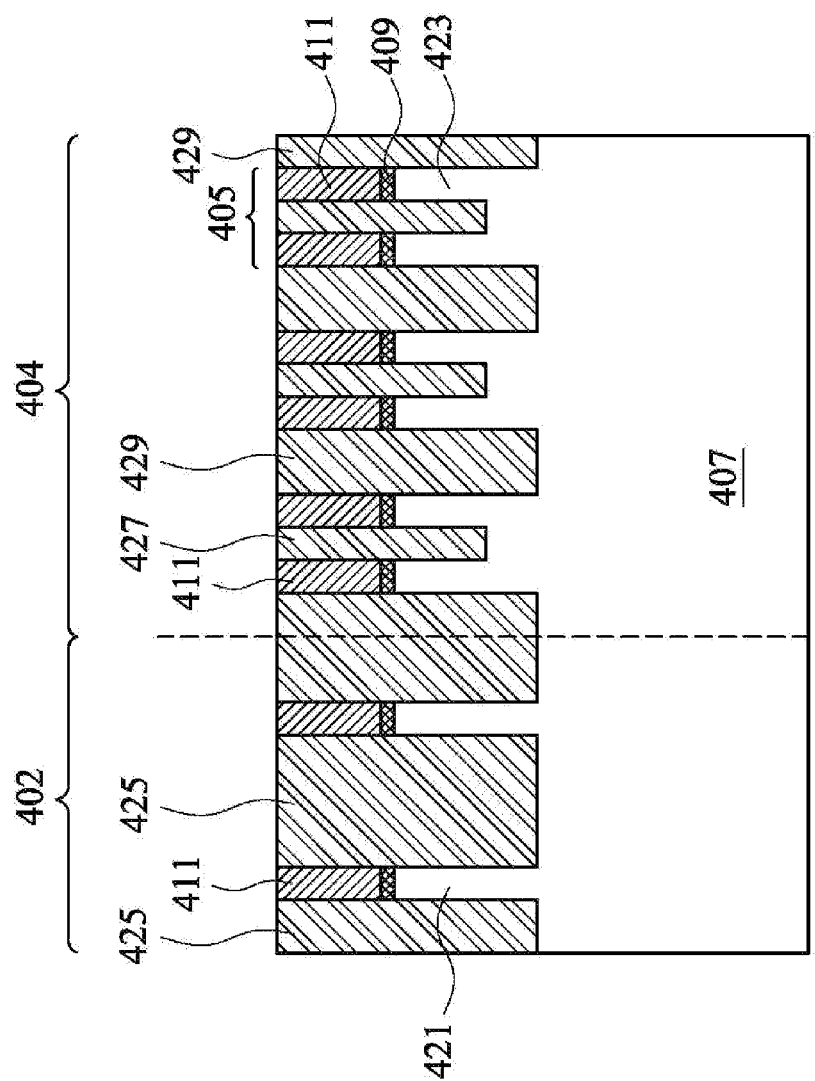

Referring to next operation 309 of FIG. 3, the workpiece is planarized to remove excess dielectric material over the fins and expose the hardmask layer, for example, hardmask layer 411 of FIG. 4C. The planarization process involves chemical mechanical polishing (CMP) of the workpiece surface, and may additionally or instead involve etching of the workpiece. FIG. 4C illustrates the cross section of the partially fabricated BJT after planarization. In isolated fin area 402, a dielectric material 425 fills the gap between isolated fin structures, which includes fins 421, adhesion layer 409, and hardmask 411. The dielectric material 425 is referred to as isolated shallow trench isolation (STI) 425. In fin array area 404, a dielectric material 429 fills the gap between fin arrays 405, which includes in the illustrated embodiment two fins 423, adhesion layer 409, and hardmask 411. The dielectric material 429 is referred to as inter-array STI 429. Between fin structures in one fin array 405 in the fin array area 404, a dielectric material 427 fills the gap between fin structures, which includes fin 423, adhesion layer 409, and hardmask 411. The dielectric material 427 is referred to as intra-array STI 427. Isolated STI 425, inter-array STI 429, and intra-array STI 427 are collectively referred to as STI features. While isolated STI 425 and inter-array STI 429 have similar thicknesses, their thicknesses are greater than that of intra-array STI 427.

Figure 4D:
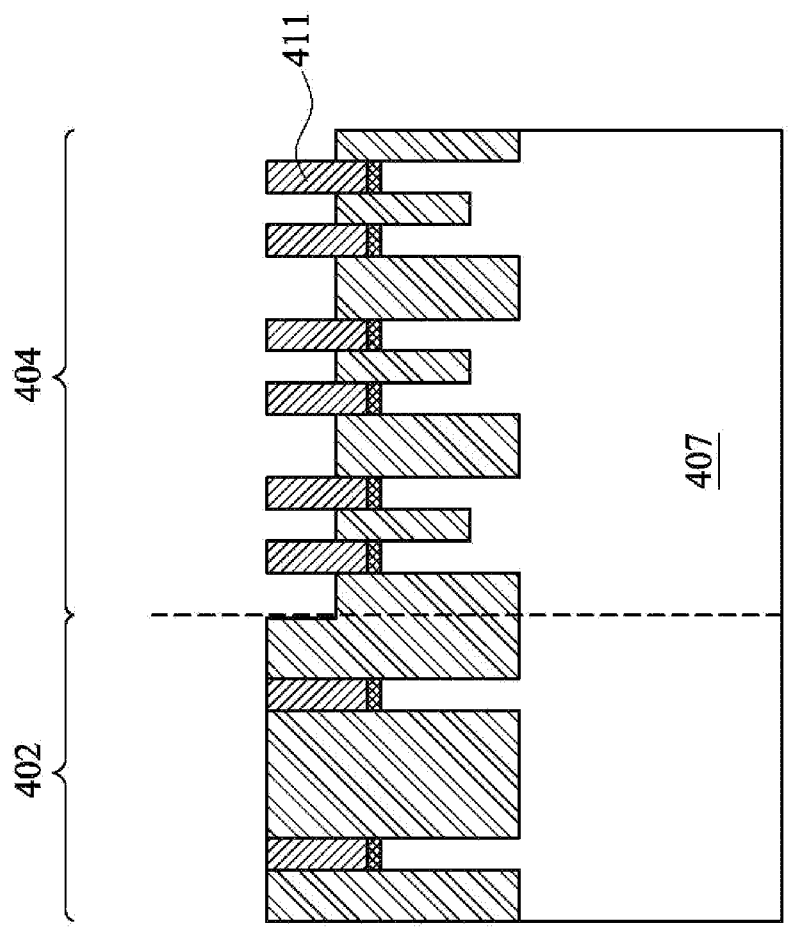

Referring back to FIG. 3, in optional operation 311 a portion of the dielectric material over the fin array area is removed. FIG. 4D is a cross section diagram of the partially fabricated BJT with a portion of the dielectric material (from inter-array STI 429 and intra-array STI 427) over the fin array area 404 is removed. The operation involves first masking the isolated fin area 402 from an etching process, either dry etch or wet etch. In at least one example, a photoresist layer is deposited and patterned over the partially fabricated BJT to expose the fin array area 404. The partially fabricated BJT is then etched in an etch process that selectively removes the STI material over the hardmask material 411. The photoresist layer is removed before the next operation.

Figure 4E:
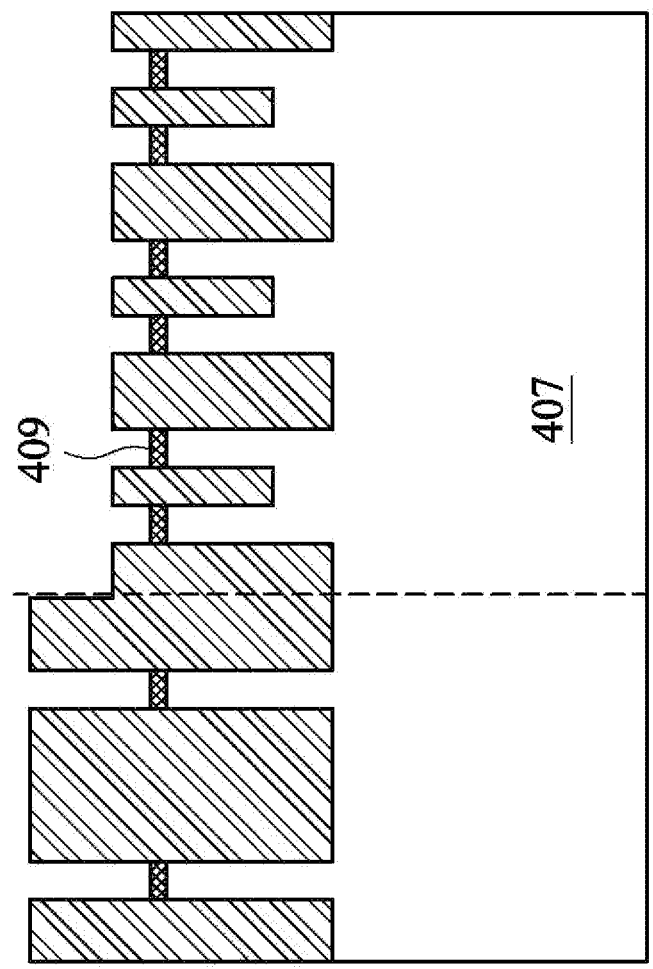

In operation 312 of FIG. 3, the hardmask layer is removed. According to some embodiments, the hardmask material is silicon nitride, silicon oxynitride, or carbon-doped silicon nitride. An etch process that selectively removes the hardmask material over the STI material, typically silicon oxide, is used. FIG. 4E is a cross section diagram of the partially fabricated BJT after the hardmask layer has been removed. Only the adhesion layer 409 and the STI features remain over the semiconductor substrate 407 having a fin pattern.

Figure 4F:
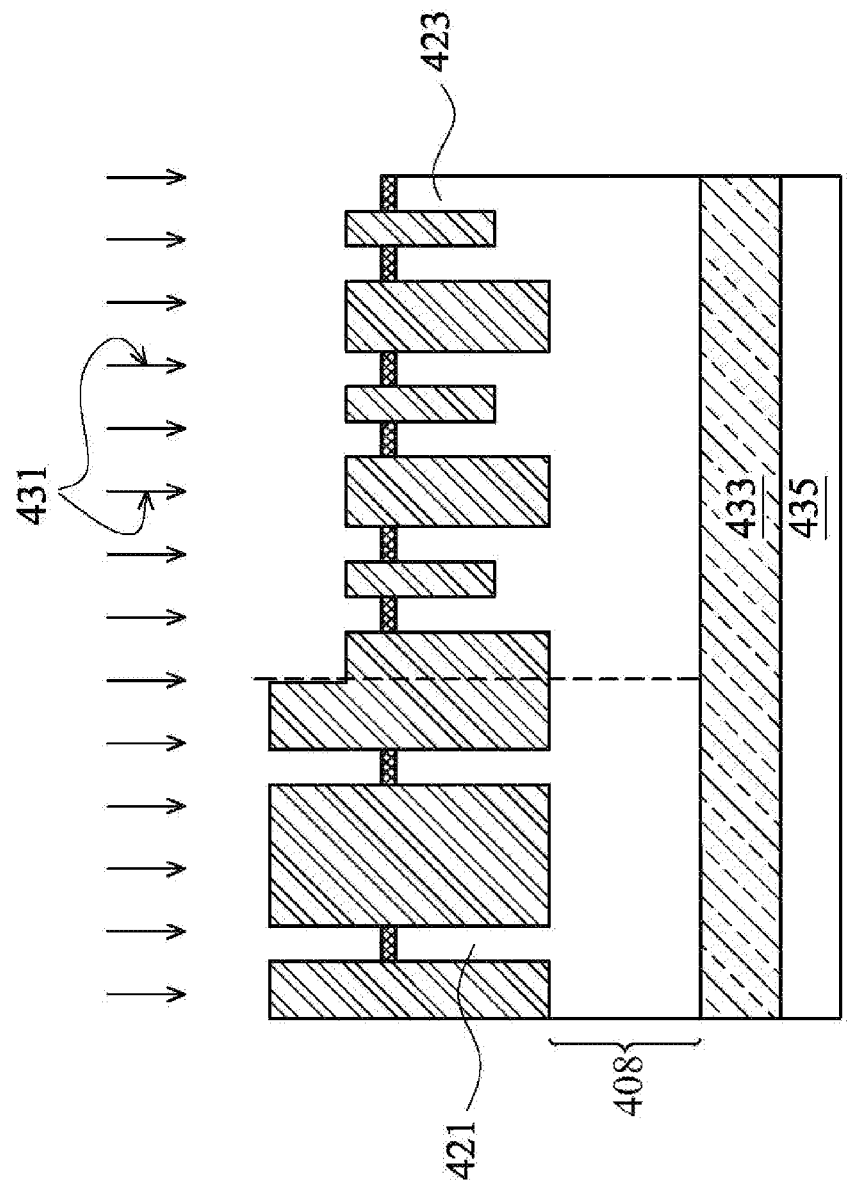

Referring back to FIG. 3, in operation 313 a deep n-well is formed in the semiconductor substrate. The deep n-well is formed by implanting n-type dopants, such as phosphorous and arsenic, into the semiconductor substrate at a high energy to cause a high concentration of dopants at a depth below the n-well and p-well of the BJT. According to various embodiments, the deep n-well (DNW) is at least 250 nm and may be more than 400 nm to about 1600 nm below the top of the fins. FIG. 4F illustrates the process and results from the DNW formation. Dopants 431 are implanted into the partially fabricated BJT to form a DNW 433 at a predetermined depth. Hence, a portion of the semiconductor substrate 407 from FIGS. 4A to 4E is converted to the DNW 433 and the remaining portion 435 retains p-type conductivity. Another remaining portion 437 of the semiconductor substrate 407 between the fins 421/423 and the DNW 433 also retains p-type conductivity.

Figure 4G:
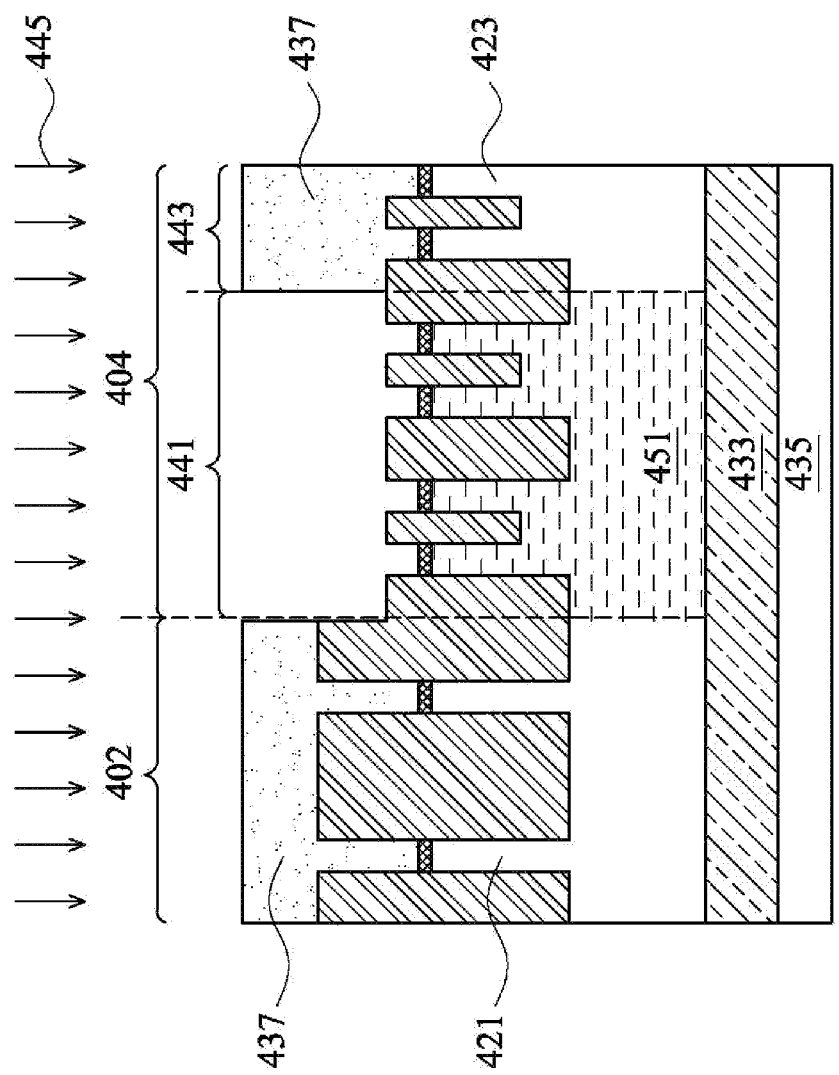

Referring back to FIG. 3, in the next operation 314, a p-type dopant, such as boron, is implanted into a portion of the fin array area and the FinFET area to form p-wells. As discussed with respect to FinFET formation, p-wells and n-wells are formed in the source and drain regions of the FinFET. At the same time a p-well in formed in the FinFETs, a p-well is also formed in the partially fabricated BJT, as illustrated in FIG. 4G. A photoresist 437 is deposited to mask the isolated fin area 402 and a portion of the fin array area 404 from a p-type dopant implantation 445. The photoresist 437 separates the fin array area 404 into a p-well region 441 and an n-well region 443. Only the p-well region 441 is exposed to the p-type dopant implantation 445. This implantation involves relatively high dosage to create a p-well region 451 than that used to create a p-type substrate portion 407, and the resulting dopant concentration difference is one or two orders of magnitude. A depth of the p-well region 451 may be about 40 nm to about 240 nm deep. After the p-type dopant implantation 445, the photoresist 437 is removed.

Figure 4H:
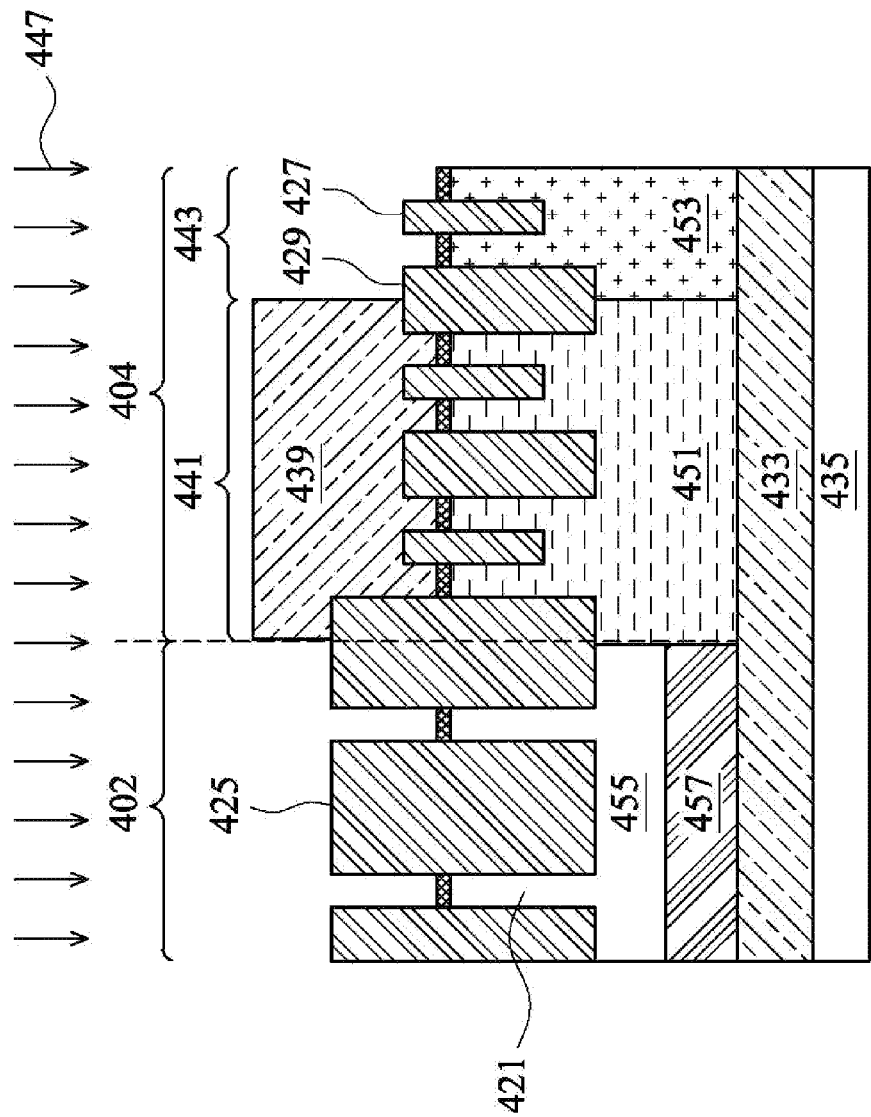

Referring back to FIG. 3, in the next operation 315, an n-type dopant, such as phosphorous, is implanted into a portion of the fin array area, the isolated fin area, and the FinFET area to form n-wells. As discussed with respect to FinFET formation, p-wells and n-wells are formed in the source and drain regions of the FinFET. At the same time an n-well in formed in the FinFETs, n-wells are also formed in the partially fabricated BJT, as illustrated in FIG. 4H. A photoresist 439 is deposited to protect the p-well region 441 from an n-type dopant implantation 447; thus, the n-well region 443 in the fin array area 404 and the isolated fin areas 402 are exposed to the n-type dopant implantation 447. This implantation involves relatively high dosage to create n-wells 453 and 455, as compared to the dosage used to create DNW 433. Even though n-wells 453 and 455 are exposed to the same implantation process, n-wells having different depths are formed. The n-well 453 has the same depth as the p-well 451, at about 40 nm to about 240 nm deep, because the fins and material layers over these wells are the same. The n-well 453 and p-well 451 are similar to the wells formed in the FinFETs. On the other hand, the n-well 455 has a lesser depth. Because the ions implant through different materials such as STI and silicon at different rates, having STI features of different thicknesses causes a different amount of dopant ions to reach the n-well 455 as compared to the n-well 453. In other words, more of the dopant ions are absorbed by the isolated STI 425 than those absorbed by the inter-array STI 429 and the intra-array STI 427. The difference in n-well depths may be controlled by the type and amount of STI material and implantation dose and energy. The difference in n-well depths causes a region 457 below to be relatively free of n-type dopant. After the n-type dopant implantation 447, the photoresist 439 is removed.

Figure 4I:
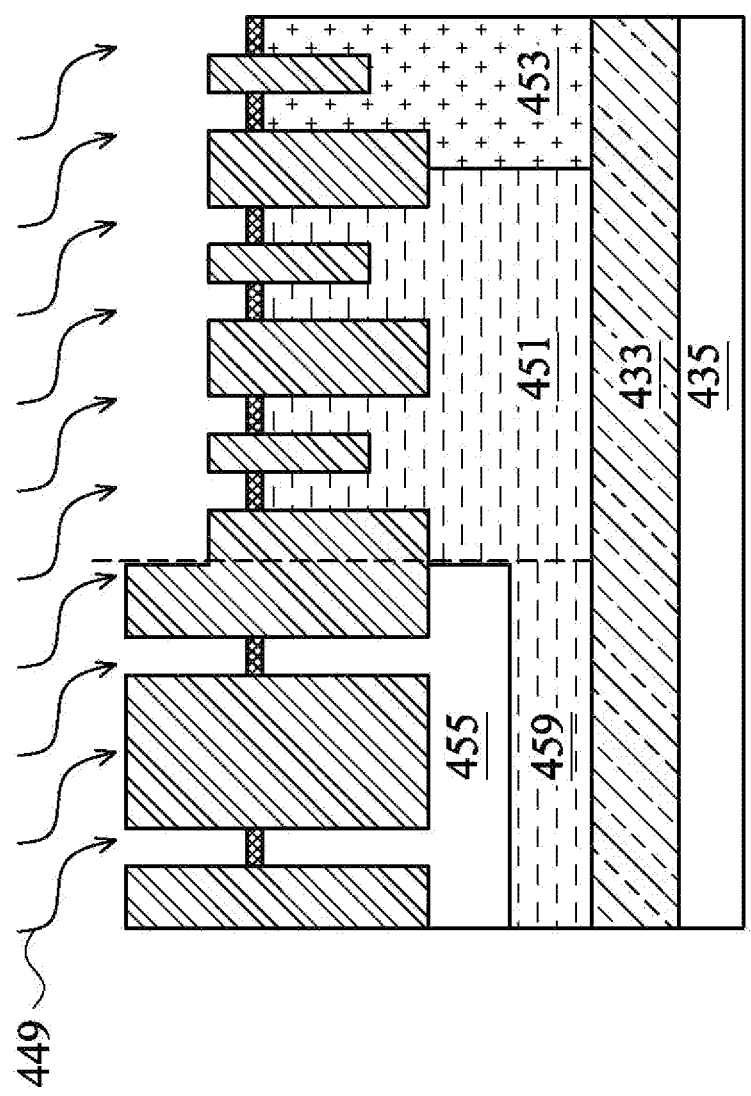

In the next operation 317, the semiconductor substrate is annealed. The annealing activates the various dopants implanted in operations 313, 314, and 315 and promotes some of the dopants to migrate. Because the region 457 below the n-well 455 is lightly doped with p-type, it is particularly susceptible to migration from highly doped p-well 451. FIG. 4I is a cross section diagram of the partially fabricated BJT being subjected to a heat energy 449 and forming a p-well 459 under the n-well 455. During the anneal, p-type dopants from p-wells 451 laterally surrounding the n-well 455 migrate to the area below the n-well 455 and form a contiguous p-well around the n-well 455 including both p-well 451 and p-well 459. As result, the dopant concentration in p-well 459 is lower than that in the p-well 451.

Figure 4J:
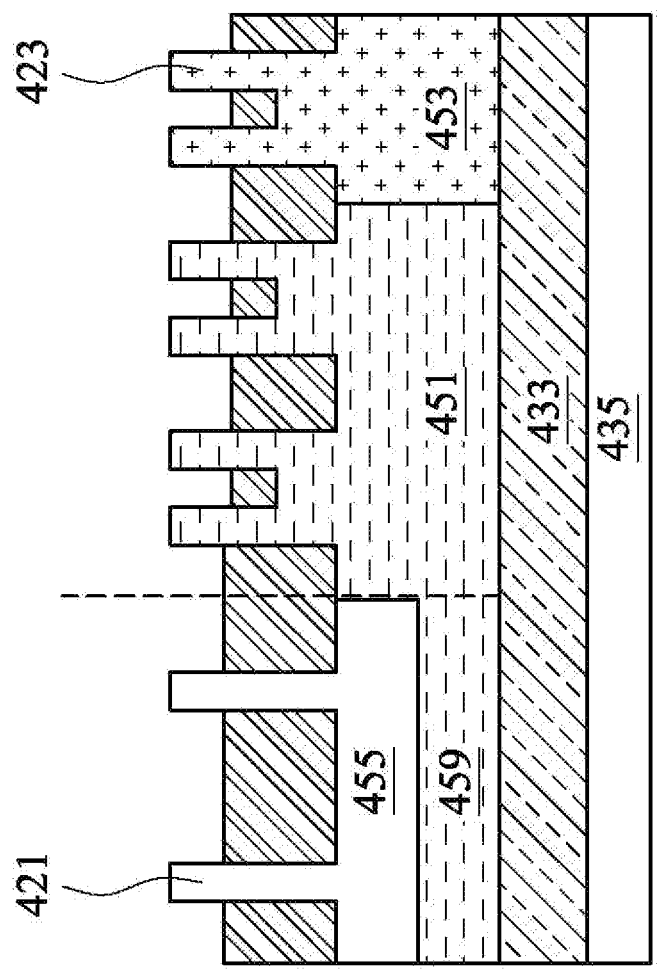

Before or after the annealing, the STI features may be etched to expose a portion of the fins as illustrated in FIG. 4J. The STI etch also removes any adhesion layer 409 over the fins. After the STI etch, a top portion of the fins 421 and 423 are exposed above the STI features and a bottom portion of the fins 421 and 423 are embedded within the STI features.

Figure 4K:
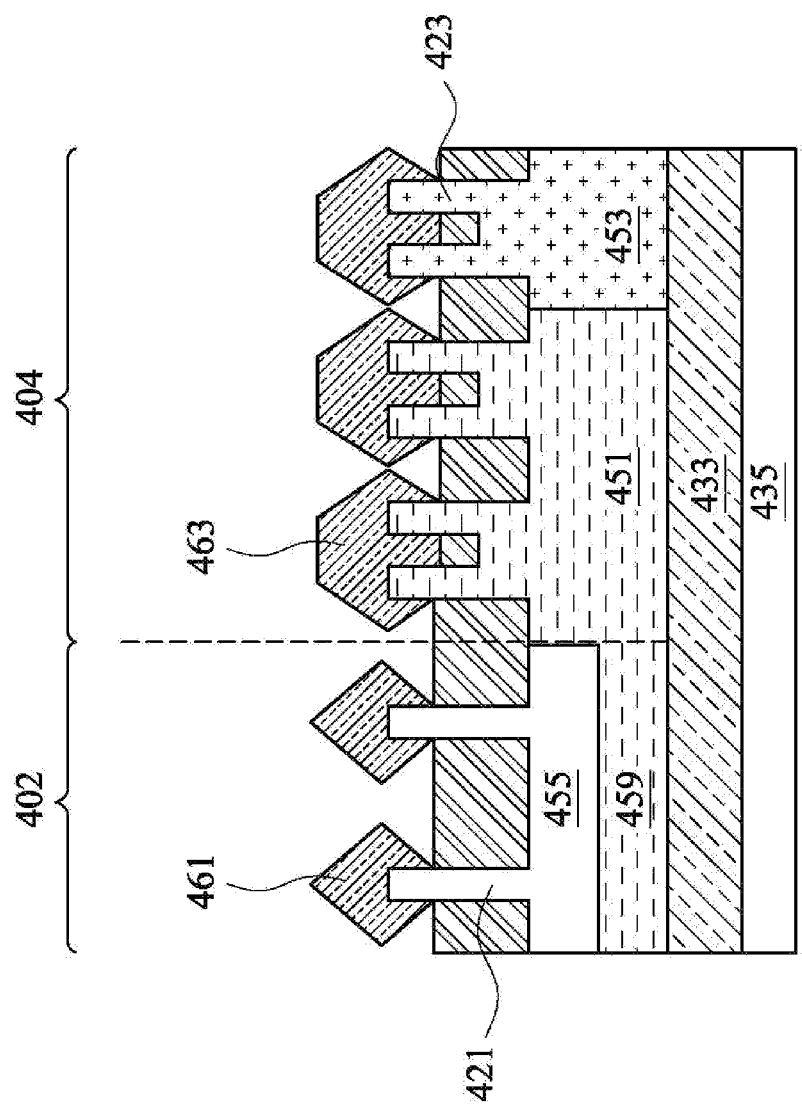

Referring back to FIG. 3, in operation 319 a silicon germanium or a silicon carbide cap is epitaxially grown over each of the fins. As shown in FIG. 4K, a cap 461 is grown over the top portion of fins 421 and a cap 463 is grown over the top portion of fins 423, where the fins 423 having a high density causes the cap grown for each fin array to merge. The specific shape of the caps depends on growth conditions and an amount of exposed fins. In some embodiments, a polysilicon material is deposited over the fins and is patterned.

Figure 4L:
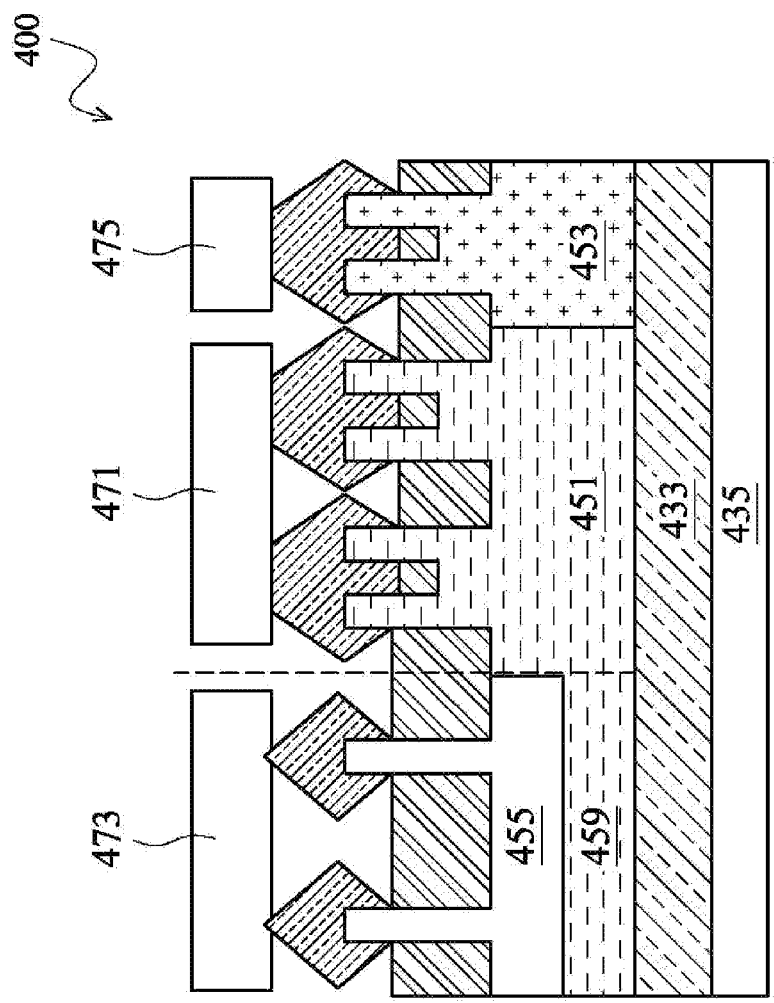

Referring back to FIG. 3, next operations 321 and 323 are chosen depending on whether the device formed is to be used as a diode or a BJT. Operation 321 is forming a positive contact and a negative contact for a diode. FIG. 4L illustrates a diode having a positive contact 473 and a negative contact 471. Alternatively, operation 323 may be chosen that forms a base contact, a collector contact, and an emitter contact for a BJT. As shown in FIG. 4L, a BJT 400 includes a base contact 471, a collector contact 475, and an emitter contact 473.

Figure 5:
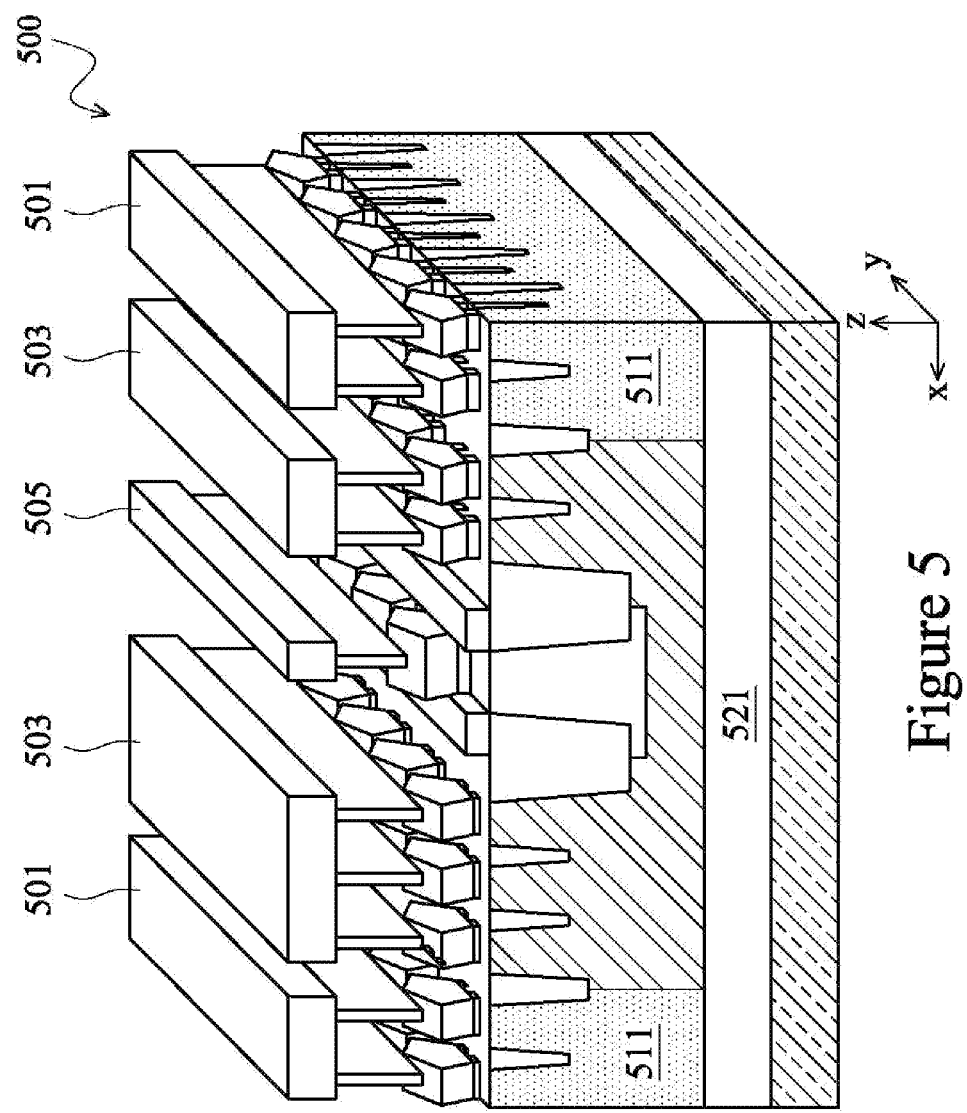
FIG. 5 is a perspective view of a diode or BJT formed in accordance with various embodiments of the present disclosure.

FIG. 5 is a perspective view of a diode or BJT 500 formed in accordance with various embodiments of the present disclosure. The cross section of the x-z plane is that of the cross section of FIG. 1B. The cross section of the y-z plane is that of the cross section of FIGS. 4A to 4L. When the contacts 503 and 505 are positive and negative terminals of a diode, contact 501 may be connected to ground to reduce substrate noise. Contacts 501, an n-well 511, a deep n-well 521, together form an n-doped envelope around the diode. As a BJT 500, contacts 501 are collectors; contacts 503 are bases; and a contact 505 is an emitter. Further isolation may be used around the entire BJT.

According to various aspects of the present disclosure, a novel diode or BJT is disclosed utilizing FinFET manufacturing steps while avoiding additional processes. The diode includes a semiconductor substrate having a plurality of fins in a isolated fin area and a plurality of fin arrays in a fin array area, an n-well in the isolated fin area having an n-well depth, a p-well in the isolated fin area below the n-well, and, a p-well in the fin array area having a p-well depth greater than the n-well depth in the isolated fin area and is contiguous to the p-well in the isolated fin area. A fin pitch in the isolated fin area is greater than about 0.3 microns. The intra-array fin pitch in the fin array area is less than about 50 nanometers (nm). The BJT includes a semiconductor substrate having a plurality of fins in an isolated fin area and a plurality of fin arrays in a fin array area, and shallow trench isolation (STI) features laterally surrounding the plurality of fins in the isolated fin area. An n-well in the isolated fin area is partially below the STI features, with a p-well in the isolated fin area below the n-well having a minimum thickness of 35 nm. A p-well in the fin array area has a p-well depth greater than the n-well depth in the isolated fin area and is contiguous to the p-well in the isolated fin area. One or more STI features between fin arrays and an n-well laterally surrounding the p-well are in the fin array area. A deep n-well is below the p-well and the n-well in the fin array area and is contiguous to the n-well in the fin array area. The STI features in the isolated fin area have a depth greater than the depth of STI features in the fin array area.

According to other aspects of the present disclosure a method for forming one or more diodes in a fin field-effect transistor (FinFET) device is disclosed utilizing FinFET manufacturing steps while avoiding additional processes. The method includes providing a semiconductor substrate, forming a hardmask layer having a fin pattern, etching a plurality of fins in the semiconductor substrate using the fin pattern, depositing a dielectric material over the semiconductor substrate to fill spaces between the plurality of fins, planarizing to expose the hardmask layer, implanting a p-type dopant into the fin array area to form a p-well and portions of the FinFET area to form a p-well, implanting an n-type dopant into the isolated fin area and a portion of the of fin array area surrounding the p-well to form n-wells and portions of the FinFET area to form an n-well, and annealing. The fin pattern including an isolated fin area having low fin density, a fin array area having a higher fin density, and a FinFET area. The n-well in the isolated fin area and the n-well in the portion of the fin array area have different depths.

Although the embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A diode comprising:
   a semiconductor substrate having a plurality of fins in an isolated fin area and a plurality of fin arrays in a fin array area;
   an n-well in the isolated fin area having an n-well depth;
   a p-well in the isolated fin area below the n-well; and,
   a p-well in the fin array area having a p-well depth greater than the n-well depth and contiguous to the p-well in the isolated fin area;
   wherein a fin pitch in the isolated fin area is greater than about 0.3 microns, and wherein an intra-array fin pitch in the fin array area is less than about 50 nanometers (nm).

2. The diode of claim 1, wherein the p-well in the isolated fin area has a minimum thickness of 35 nm.

3. The diode of claim 1, further comprising
a deep n-well below the p-well in the isolated fin area and the fin array area, and
at least one n-well laterally surrounding the p-well in the fin array area.

4. The diode of claim 1, wherein the at least one n-well is a collector terminal in a bipolar junction transistor (BJT).

5. The diode of claim 1, wherein each of the plurality of fin arrays in the fin array area comprises 2 fins.

6. The diode of claim 1, further comprising one or more shallow trench isolation (STI) features between the plurality of fin arrays in the fin array area.

7. A bipolar junction transistor (BJT) comprising:
a semiconductor substrate having a plurality of fins in an isolated fin area and a plurality of fin arrays in a fin array area;
shallow trench isolation (STI) features laterally surrounding the plurality of fins in the isolated fin area;
an n-well in the isolated fin area partially below the STI features;
a p-well in the isolated fin area below the n-well having a minimum thickness of 35 nm;
a p-well in the fin array area having a p-well depth greater than the n-well depth in the isolated fin area and is contiguous to the p-well in the isolated fin area;
one or more STI features between fin arrays in the fin array area;
an n-well laterally surrounding the p-well in the fin array area; and
a deep n-well below the p-well and the n-well in the fin array area that is contiguous to the n-well in the fin array area,
wherein the STI features in the isolated fin area have a depth greater than a depth of STI features in the fin array area.

8. The BJT of claim 7, wherein the n-well in the isolated fin area is a negative terminal of a diode and the p-well in the fin array is a positive terminal of the diode.

9. The BJT of claim 7, wherein the n-well in the isolated fin area is about 35 nm to about 105 nm below the STI features.

10. The BJT of claim 7, wherein a maximum width of the n-well in the isolated fin area is between about 0.2 microns to about 5 microns.

11. A diode comprising:
a semiconductor substrate having an isolated fin area and a fin array area;
a first plurality of fins in the isolation fin area;
a second plurality of fins in the fin array area;
a first n-well in the isolated fin area having a first n-well depth;
a first p-well in the isolated fin area below the first n-well; and,
a second p-well in the fin array area having a second p-well depth greater than the first n-well depth and contiguous to the first p-well;
a first cap layer on each fin of the first plurality of fins; and
a second cap layer on each fin of the second plurality of fins, wherein the second cap layer of adjacent fins of the second plurality of fins are merged.

12. The diode of claim 11, wherein the first cap layer and the second cap layer comprise at least one of silicon germanium or silicon carbide.

13. The diode of claim 11, wherein each fin of the first plurality of fins is in electrical contact with the first n-well, and each fin of the second plurality of fins is in electrical contact with the second p-well.

14. The diode of claim 13, further comprising:
a second n-well in the fin array area, the second n-well surrounding the second p-well; and
a third plurality of fins in the fin array area, each fin of the third plurality of fins in electrical contact with the second n-well.

15. The diode of claim 14, further comprising:
an emitter contact over the first plurality of fins;
a base contact over the second plurality of fins; and
a collector contact over the third plurality of fins.

16. The diode of claim 11, further comprising:
a first shallow trench isolation (STI) feature separating adjacent fins of the first plurality of fins, the first STI feature having a first depth; and
a second STI feature separating adjacent fins of the second plurality of fins, the second STI feature having a second depth less than the first depth.

17. The diode of claim 11, wherein a pitch between adjacent fins of the first plurality of fins is less than a pitch between adjacent fins of the second plurality of fins.

18. The diode of claim 17, wherein the pitch between the adjacent fins of the first plurality of fins is greater than about 0.3 microns, and the pitch between the adjacent fins of the second plurality of fins is less than about 50 nanometers (nm).

19. The diode of claim 11, a deep n-well below both the first p-well and the second p-well.

20. The diode of claim 11, wherein at least one fin of the second plurality of fins comprises:
a first sidewall having a first length; and
a second sidewall opposite the first sidewall, the second sidewall having a second length different from the first length.

* * * * *